United States Patent
Adrian et al.

(10) Patent No.: US 10,317,957 B2
(45) Date of Patent: Jun. 11, 2019

(54) MODULAR DENSE STORAGE ARRAY

(71) Applicant: Dell Products, L.P., Round Rock, TX (US)

(72) Inventors: Jason D. Adrian, Williamsburg, VA (US); Douglas L. Farley, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 122 days.

(21) Appl. No.: 15/079,584

(22) Filed: Mar. 24, 2016

(65) Prior Publication Data

US 2016/0202738 A1    Jul. 14, 2016

Related U.S. Application Data

(63) Continuation of application No. 13/935,181, filed on Jul. 3, 2013, now Pat. No. 9,320,169.

(51) Int. Cl.
*H05K 7/00* (2006.01)
*G06F 1/18* (2006.01)
*H05K 7/14* (2006.01)

(52) U.S. Cl.
CPC .......... *G06F 1/187* (2013.01); *H05K 7/1494* (2013.01); *Y10T 29/49826* (2015.01)

(58) Field of Classification Search
None
See application file for complete search history.

(56) References Cited

U.S. PATENT DOCUMENTS

| | | | | |
|---|---|---|---|---|
| 5,112,119 A | * | 5/1992 | Cooke | G06F 1/184 312/283 |
| 5,277,615 A | * | 1/1994 | Hastings | G06F 1/181 361/679.32 |
| 5,673,172 A | * | 9/1997 | Hastings | G06F 1/182 361/679.34 |
| 6,456,489 B1 | * | 9/2002 | Davis | G06F 1/184 312/332.1 |
| 9,781,858 B2 | * | 10/2017 | Fricker | H05K 7/18 |
| 2010/0172087 A1 | * | 7/2010 | Jeffery | G11B 33/02 361/679.33 |
| 2011/0194242 A1 | * | 8/2011 | Hu | G06F 1/187 361/679.32 |

* cited by examiner

*Primary Examiner* — Courtney L Smith
*Assistant Examiner* — Rashen E Morrison
(74) *Attorney, Agent, or Firm* — Fogarty LLP

(57) ABSTRACT

Modular dense storage arrays are disclosed. In some embodiments, a modular storage array may include a chassis configured to receive a plurality of drive bay modules, a first of the plurality of drive bay modules configured to receive a first plurality of storage drives in the absence of a drive adaptor, each of the first plurality of storage drives having a first form factor, and a second of the plurality of drive bay modules configured to receive a second plurality of storage drives in the absence of the drive adaptor, each of the second plurality of storage drives having a second form factor different from the first form factor.

15 Claims, 7 Drawing Sheets

MODULAR DENSE STORAGE ARRAY

CROSS-REFERENCE TO RELATED APPLICATION

This patent application a continuation of, and claims priority to, U.S. patent application Ser. No. 13/935,181, titled "Modular Dense Storage Array" and filed on Jul. 3, 2013, the disclosure of which is hereby incorporated herein by reference.

FIELD

This disclosure relates generally to Information Handling Systems (IHSs), and more specifically, to modular dense storage arrays.

BACKGROUND

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

IHSs may be part of an information storage network. A storage network may be considered as a specialized network of storage devices coupled to one or more data servers or the like. Storage may be performed, for example, using one or more storage arrays placed within storage enclosures. A storage enclosure is a self-contained physical structure that includes within it a number of storage elements or drives. Examples of storage elements or drives includes disk-based hard drives, etc.

SUMMARY

Embodiments of modular dense storage arrays are described herein. In an illustrative, non-limiting embodiment, a modular storage array may include a chassis configured to receive a plurality of drive bay modules, a first of the plurality of drive bay modules configured to receive a first plurality of storage drives in the absence of a drive adaptor, each of the first plurality of storage drives having a first form factor, and a second of the plurality of drive bay modules configured to receive a second plurality of storage drives in the absence of the drive adaptor, each of the second plurality of storage drives having a second form factor different from the first form factor. For example, the first plurality of storage drives may be hard drives having a 3.5-inch form factor, and the second plurality of storage drives may be hard drives having a 2.5-inch form factor.

In some implementations, each of the plurality of drive bay modules may include a first protocol expander device located at one end of the drive bay module and a second protocol expander device located at the other end of the drive bay module. For example, the first and second protocol expander devices may be Serial Attached Small Computer System Interface (SCSI) (SAS) devices or Peripheral Component Interconnect (PCI) Express (PCIe) devices.

Each of the plurality of drive bay modules may include a bottom-plane, where each bottom-plane includes a plurality of connectors, and where each of the plurality of connectors is configured to receive a corresponding one of the pluralities of storage drives. For instance, first drive bay module may include a first bottom-plane configured to accommodate the first form factor, where the second drive bay module includes a second bottom-plane configured to accommodate the second form factor, and where the first bottom-plane is wider than the second bottom-plane.

Additionally or alternatively, the chassis may include a mid-plane, where the mid-plane includes: a first set of connectors configured to be coupled to a first set of protocol expander devices located at an end of the plurality of drive bay modules via corresponding bottom-plane connectors, and a second set of connectors configured to be coupled to a second set of protocol expander devices located at another end of the plurality of drive bay modules via corresponding bottom-plane connectors.

The chassis may be configured to receive a storage controller, and the storage controller may be configured to be coupled to the mid-plane. The storage controller may include a protocol expander device coupled to a protocol controller, and the protocol expander device may be configured to be coupled to the first set of protocol expander devices located at the end of the plurality of drive bay modules.

Moreover, the chassis may be configured to receive another storage controller, where the other storage controller is configured to be coupled to the mid-plane. The other storage controller may include another protocol expander device coupled to another protocol controller, and the other protocol expander device may be configured to be coupled to the second set of protocol expander devices located at the other end of the plurality of drive bay modules. The protocol controller may be configured to be coupled to the other protocol expander device and the other protocol controller may be configured to be coupled to the protocol expander device.

In addition, the chassis may include a configurable track system having a plurality of rails operable to be moved to interchangeably accommodate the first and the second of the plurality of drive bay modules.

In another illustrative, non-limiting embodiment, a method may include providing a chassis configured to receive a plurality of drive bay modules, the chassis including a configurable track system having a plurality of rails operable to accommodate a plurality of drive bay modules, each of the plurality of drive bay modules configured to receive a plurality of storage drives. The method may also include receiving an instruction to populate the chassis with at least two different types of storage drives, each type of storage drive having a different form factor, and adjusting the configurable track system to accommodate at least two different types of drive bay modules, each different type of drive bay module having a different width corresponding to the different form factors. The method may further include adding a plurality of drive bay modules to the chassis, a first one of the plurality of drive bay modules configured to receive a first plurality of storage drives having a first form factor, and a second of the plurality of drive bay modules configured to receive a second plurality of storage drives having a second form factor.

Each of the plurality of drive bay modules may include a first protocol expander device located at an end of the drive bay module and a second protocol expander device located at another end of the drive bay module. Each of the plurality of drive bay modules may include a bottom-plane, where each bottom-plane includes a plurality of connectors, and where each of the plurality of connectors is configured to receive a corresponding one of the pluralities of storage drives.

The chassis may include a mid-plane, and the mid-plane may include: a first set of connectors configured to be coupled to a first set of protocol expander devices located at an end of the plurality of drive bay modules via corresponding bottom-plane connectors, and a second set of connectors configured to be coupled to a second set of protocol expander devices located at another end of the plurality of drive bay modules via corresponding bottom-plane connectors.

In yet another illustrative, non-limiting embodiment, a storage system may include a chassis including a configurable track system having a plurality of adjustable rails operable to accommodate a plurality of drive bay modules, a first drive bay module configured to receive a first plurality of storage drives, each of the first plurality of storage drives having a first form factor, a second drive bay module configured to receive a second plurality of storage drives in the absence of a drive adaptor, each of the second plurality of storage drives having a second form factor, and a storage controller coupled to the first and second pluralities of storage drives.

In some cases, each of the pluralities of drive bay modules may include a bottom-plane, where each bottom-plane includes a plurality of connectors, and where each of the plurality of connectors is configured to receive a corresponding one of the pluralities of storage drives. Also, the chassis may include a mid-plane, and where the mid-plane includes: a first set of connectors configured to be coupled to a first set of protocol expander devices located at an end of the pluralities of drive bay modules via corresponding bottom-plane connectors, and a second set of connectors configured to be coupled to a second set of protocol expander devices located at another end of the pluralities of drive bay modules via corresponding bottom-plane connectors.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
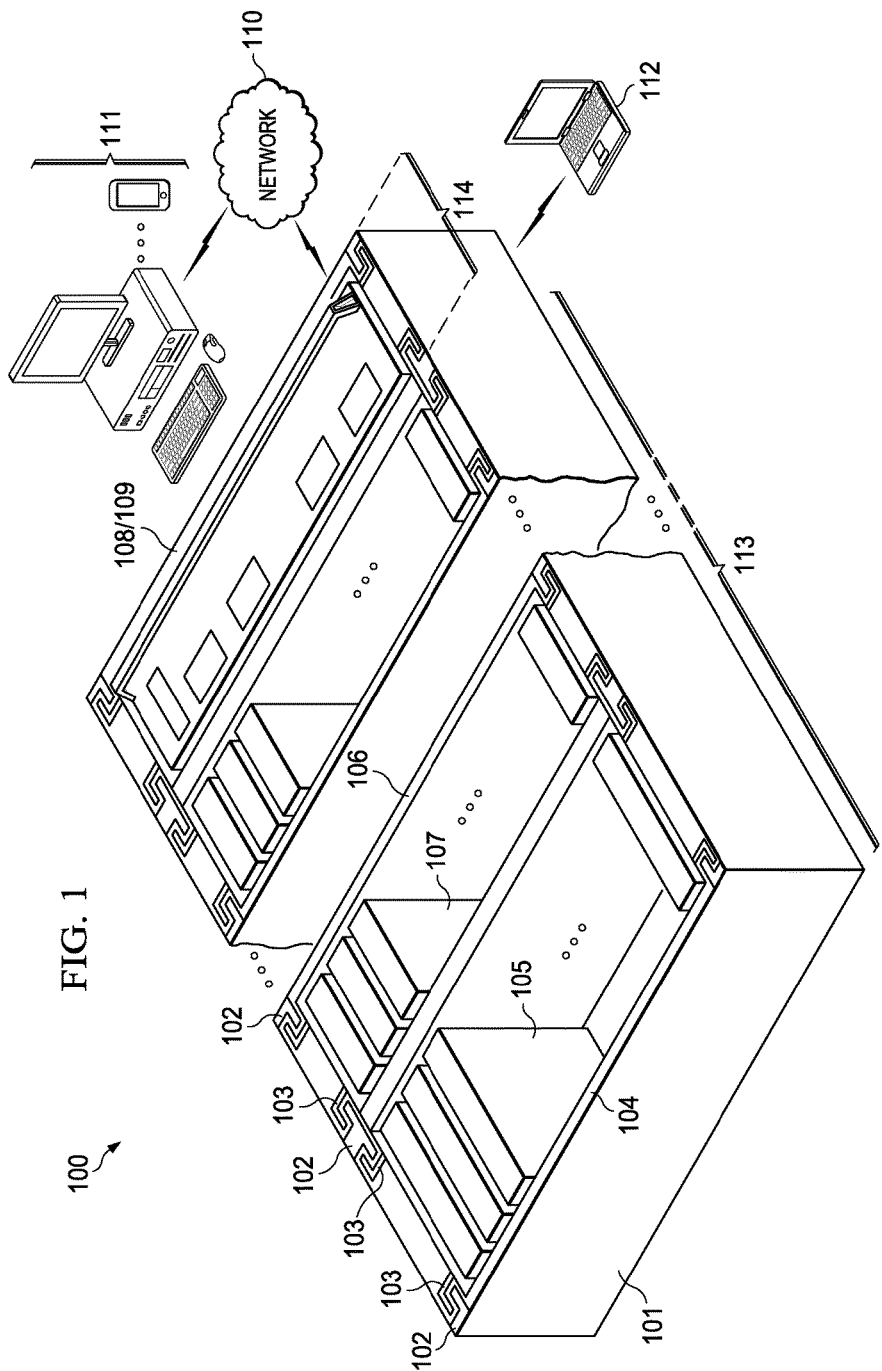
FIG. 1 shows a three-dimensional view of an example of a modular dense storage array according to some embodiments.

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of the information handling system may include one or more disk drives, one or more network ports for communicating with external devices as well as various Input/Output (I/O) devices, such as a keyboard, a mouse, touchscreen, and/or a video display. An IHS may also include one or more buses operable to transmit communications between the various hardware components. An example of an IHS is described in more detail in FIG. 8.

Generally speaking, an IHS may be part of an information storage network. Within an information storage network, data storage may be achieved, for instance, using one or more storage arrays. Each storage array may be provided in a self-contained physical enclosure or chassis that includes within it a number of storage elements or drives, such as, for example, magnetic hard drives, optical hard drives, solid state drives, or the like (correctively referred to here as simply "drives," "storage drives," "storage devices," or "hard drives"). To create a storage array, each of a plurality of drives is inserted into a drive bay, and each of a plurality of drive bays is then inserted into a chassis.

Conventional storage arrays are typically designed to cater to the bulk storage market, which predominantly employs large 3.5" drives. In order to fit a 2.5" drive with other 3.5" drives in a 3.5" drive bay, for example, the 2.5" drive is first inserted into a 3.5" carrier or adaptor. The entire drive/adaptor assembly is then inserted in to the 3.5" drive bay, which in turn is then inserted into the chassis. The inventors hereof have recognized, however, that as dense arrays become more commonplace, the need for faster 2.5" drives will become more prevalent. However, the use of 3.5" bays that house 2.5" drive/adaptor assemblies results in a waste of physical space in the chassis, and represents a decrease in storage density.

To address these, and other concerns, certain systems and methods described herein provide a modular dense storage array. In some cases, these systems and methods allow flexible provisioning of storage devices having different form factors in the same dense array and without using drive adapters. These systems and methods also allow flexibility of protocols, such that, for example, Serial Attached Small Computer System Interface (SCSI) (SAS) drives, Peripheral Component Interconnect (PCI) Express (PCIe) drives, Fibre Channel drives, etc. may be used in a same array.

In some embodiments, a base chassis may be configured to host power, cooling, and storage controllers. The chassis may also accept drive bay modules configured to house drives having any suitable form factor. A mid-plane may be located between the modular bay area and the power/controller area. In some cases, interconnection may be provided by cabling the mid-plane to bottom-planes of each of drive bay module (e.g., via custom cable assemblies, via standard cables such as miniSAS HD internal cables, etc.). In other embodiments, a drive bay module may be used to create a PCIe variant as well with the PCIe device routed from the storage controllers down to the modular drive bays.

To manage the bays, and the modular storage array in general, each drive bay module may be treated as a separate internal "Just a bunch of disks" (JBOD) or expansion array. Each modular drive bay may be powered by a cabled assembly or busbar/Printed Circuit Board (PCB) in the chassis, and may communicate with the storage controller via SAS or PCIe. To the storage controller, each modular drive may look like an external JBOD. Thermal data and systems management may be controlled and read through SCSI Enclosure Services (SES) pages or the like. Additionally or alternatively, additional connectors may be provided with sideband signals to the drive bay modules.

To further illustrate the foregoing, FIG. 1 is a block diagram an example of a modular dense storage array 100 according to some embodiments. As shown, chassis 101 includes storage portion 113 and chassis management portion 114. Particularly, storage portion 113 includes rails 102 configured to receive a plurality of drive bay module(s) 104 and 106, each module having tabs 103 that match rails 102. Moreover, each of drive bay modules 104 and 106 is configured to house a plurality of storage devices 105 and 107, respectively.

In some implementations, storage devices 105 and 107 may have different form factors. For example, devices 105 housed within drive bay module(s) 104 may be 3.5" drives, and devices 107 housed within drive bay module(s) 106 may be 2.5" drives. Accordingly, in those cases, the width of drive bay module(s) 104 may be greater than the width of drive bay module(s) 106. More generally, storage devices 105 and 107 may be of any suitable technology (e.g., magnetic hard drives, optical hard drives, solid state hard drives), and their enclosures may have any suitable dimensions, thus resulting in any suitable form factor.

In some cases, three or more different storage device form factors may be used in the same chassis, such that three or more different types of drive bay modules (e.g., with different widths) are each responsible for housing storage devices having a corresponding form factor. When only one storage device form factor is used in a given drive bay module, it avoids the need for individual storage drive adaptors or the like, and therefore increases the density of the resulting storage array.

Rails 102 of chassis 101 and tabs 103 of module(s) 104/106 work together to create a configurable track system with adjustable widths, as shown in more detail in FIG. 2 below. It should be noted, however, that tabs 103 and rails 102 are shown by way of illustration only, and that any other type of configurable, adjustable, or movable track system may be used.

In some deployments, different portions of chassis 101 may be divided by vertical walls (not shown) into various compartments. For example, storage portion 113 may be separated from chassis management portion 114 by a vertical wall. Similarly, within storage portion 113, drive bay modules 104 and 106 may also be separated by vertical walls or the like. More generally, it should be noted that chassis 101 may be divided into any suitable number of compartments and drive bay module(s) suitable to house any number of storage devices.

Chassis management portion 114 may include one or more storage controllers 108, as well as power and/or cooling devices 109. Each storage controller 108 may be configured to perform storage access operations to fulfill memory requests or the like (e.g., from other computing devices or IHSs), and may control power and/or cooling devices 109 in order to perform certain environmental operations (e.g., control the temperature of the chassis, etc.). In some cases, storage controller(s) 108 may be communicatively coupled to remote computing devices or IHSs 111 (e.g., desktops, laptops, tablets, smartphones, etc.) via network 110. Additionally or alternatively, controller(s) 108 may be directly coupled to local computing devices or IHSs 112 (e.g., provided as direct attached storage).

Network 110 may include any network and/or fabric configured to communicatively couple various computing devices. For example, network 110 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet, or any other appropriate architecture or system that facilitates the communication of signals, data and/or messages.

Figure 2:
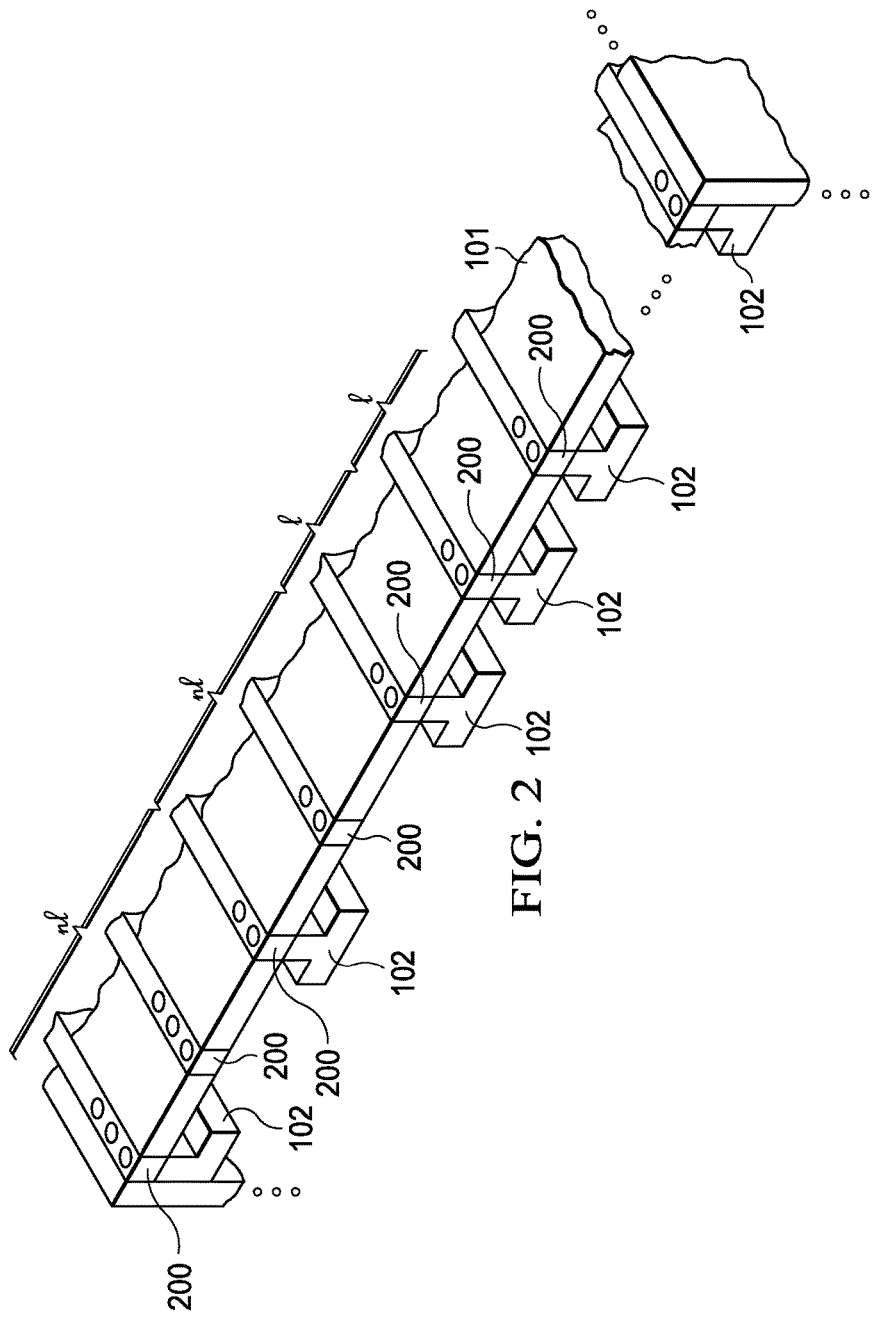
FIG. 2 shows a three-dimensional view of a track system according to some embodiments.

FIG. 2 is a three-dimensional view of a track system according to some embodiments. As previously shown in FIG. 1, chassis 101 includes a plurality of rails 102, such that tabs 103 of drive bay module(s) 104/106 may securely slide into, or otherwise be attached to chassis 101. The spacing between two neighboring rails 102 corresponds to the width of a respective drive bay module. In this case, chassis 101 includes a plurality of predrilled slots 200 to which rails 102 may attach (e.g., via screws, clips, or other suitable fasteners).

Slots 200 may be equally spaced, for instance, by a length l, and each rail 102 may be spaced from its neighbor by a multiple of l—e.g., 1.5 l, 2 l, 3 l, etc. In this example, rails spaced by l are configured to accommodate drive bay module(s) 106 (having storage drives 107 with a 2.5" form factor), whereas rails 102 spaced by 2 l are configured to accommodate drive bay module(s) 104 (having storage drives 105 with a 3.5" form factor).

In some embodiments, a manufacturer may provide a chassis such as chassis 101, which is configured to receive a plurality of drive bay modules 104/106, and that includes a configurable track system having a plurality of rails 102 operable to accommodate a plurality of drive bay modules. When the manufacturer receives an instruction to populate the chassis with at least two different types of storage drives (each having a different form factor), it may adjust the configurable track system to accommodate at least two different types of drive bay modules, each having a different width corresponding to the different form factors. For example, the manufacturer may move rails 102 to appropriate ones of slots 200. Then, the manufacturer may add a plurality of drive bay modules to the chassis, a first one of the plurality of drive bay modules configured to receive a first plurality of storage drives having a first form factor, and a second of the plurality of drive bay modules configured to receive a second plurality of storage drives having a second form factor.

Figure 3:
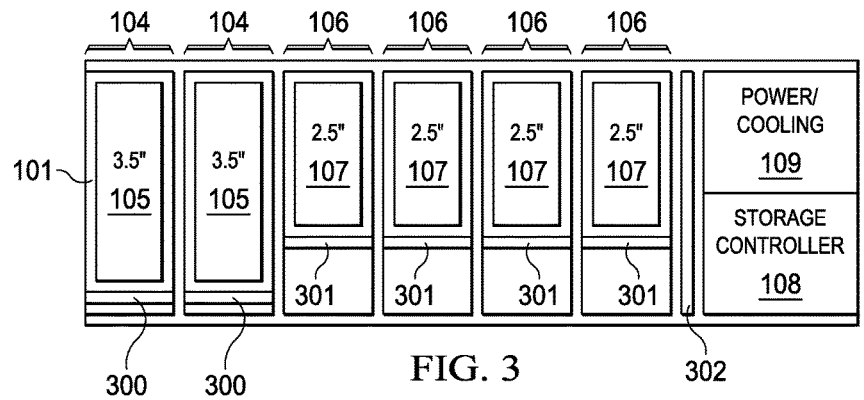
FIG. 3 shows a cross-section view of a modular dense array according to some embodiments.

FIG. 3 shows a cross-section view of a modular dense array according to some embodiments. In this example, the lateral portion of chassis 101 is cutoff to show two drive bay modules 104, each hosting a plurality of 3.5" drives 105, and four drive bay modules 106, each hosting a plurality of 2.5" drives. Power/cooling devices 109, as well as storage controller(s) 108, are also shown.

Drive bay modules 104/106 include bottom-planes 300/301, respectively. In some implementations, each bottom-plane may be a Printed Circuit Board (PCB) having a plurality of connectors. Also, each of the plurality of connectors may be configured to receive a corresponding one of the pluralities of storage drives in that particular drive bay module. In this case, bottom-planes 300 are configured to accommodate the first form factor, whereas bottom-planes 301 are configured to accommodate the second form factor. Thus, bottom-planes 300 are wider than bottom-planes 301. Chassis 101 also includes mid-plane 302, illustrated in more detail in FIG. 6.

Figure 4:
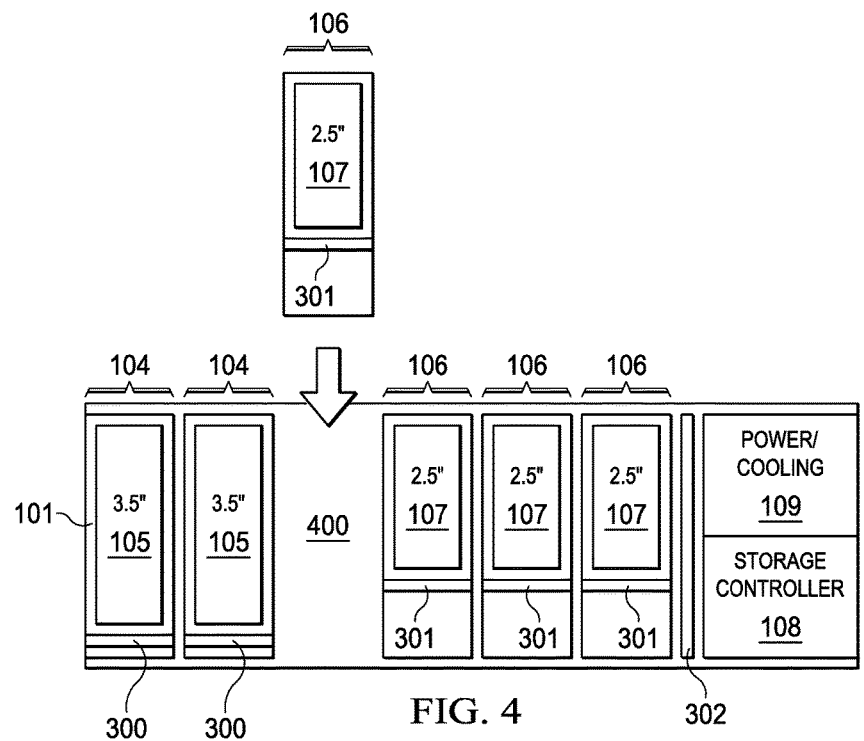
FIG. 4 shows another cross-section view of a modular dense array according to some embodiments.

FIG. 4 shows another cross-section view of the modular dense array according to some embodiments. Here, drive bay module 106 is shown removed from chassis 101. When installed, module 106 is inserted into space 400 previously defined by rails 102. In some implementations, each of drive bay module(s) 104/106 may be hot-swappable, such that they may be added and/or removed from chassis 101 without interrupting the operation of storage controller(s) 108 or other elements in the storage array.

Figure 5:
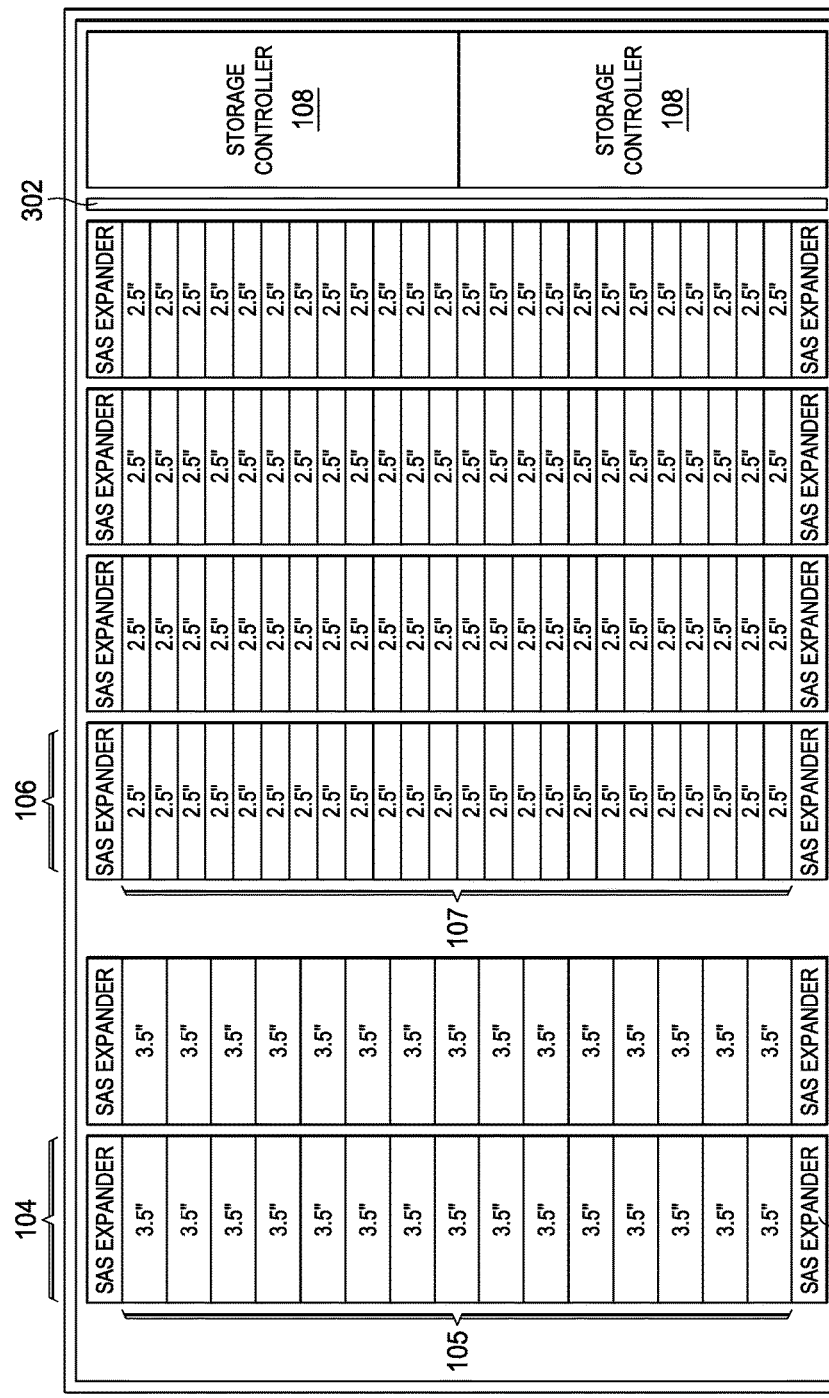
FIG. 5 shows a top view of a modular dense array according to some embodiments.

FIG. 5 shows a top view of a modular dense array according to some embodiments. As illustrated, and similarly as in FIG. 3, chassis 101 includes two drive bay modules 104, each hosting a plurality of 3.5" drives 105, and four drive bay modules 106, each hosting a plurality of 2.5" drives. Two storage controllers 108, are shown, as well as mid-plane 302.

Each of the plurality of drive bay modules 104/106 includes protocol expander devices 500 located at the ends of those modules. For example, if the protocol used by drives 105 is the SAS protocol, then protocol expander devices 500 may be SAS extenders coupled to those drives (e.g., via respective drive bay module 104's bottom-plane). In some embodiments, for any given one of drive bay modules 104/106, a first one of protocol expander devices 500 may be coupled to a first one of storage controllers 108, and a second one of protocol expander devices 500 may be coupled to a second one of storage controllers 108. Also, in some cases, protocol expanders may use different protocols in different ones of drive bay modules 104/106.

Figure 6:
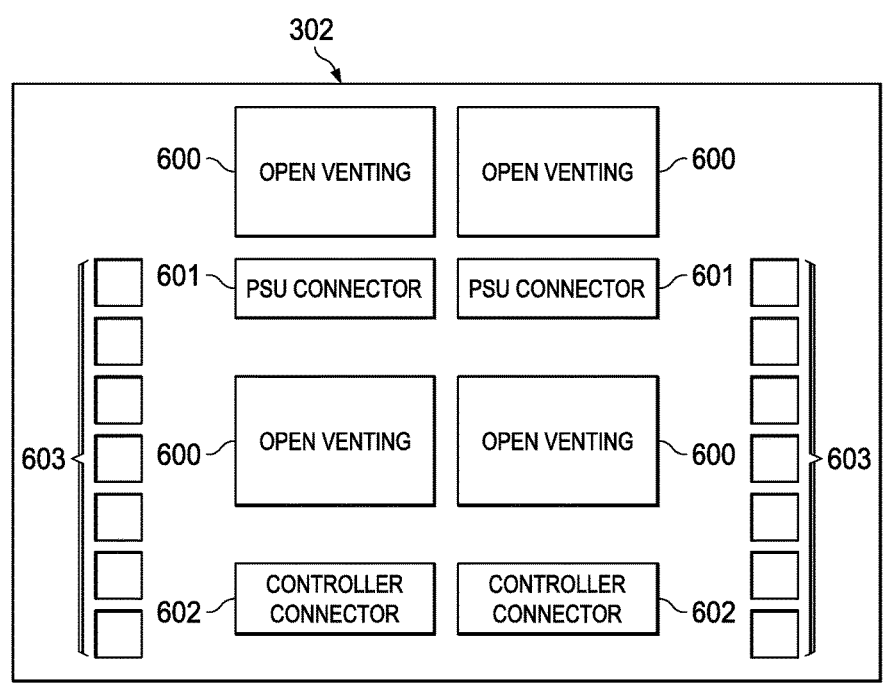
FIG. 6 shows a front view of a mid-plane according to some embodiments.

FIG. 6 is a front view of mid-plane 302 according to some embodiments. As shown, mid-plane 302 includes one or more ventilation openings 600, power supply unit (PSU) connectors 601, storage controller connectors 602, and array connectors 603. In some embodiments, mid-plane 302 may be a PCB with one or more circuits providing suitable power and/or communication terminals among the various connectors. When two storage controllers 108 are used, each of a subset of connectors 603 on one side of mid-plane 302 (e.g., the left hand side) may enable cabled communications between a selected one of storage controllers 108 and a first set of protocol expander devices 500 in each of drive bay modules 104/106. Meanwhile, each of a subset of connectors 603 on the other side of mid-plane 302 (e.g., the right hand side) may enable cabled communications between the other one of storage controllers 108 and a second set of protocol expander devices 500 in drive bay modules 104/106 to support redundant operations or the like.

Figure 7:
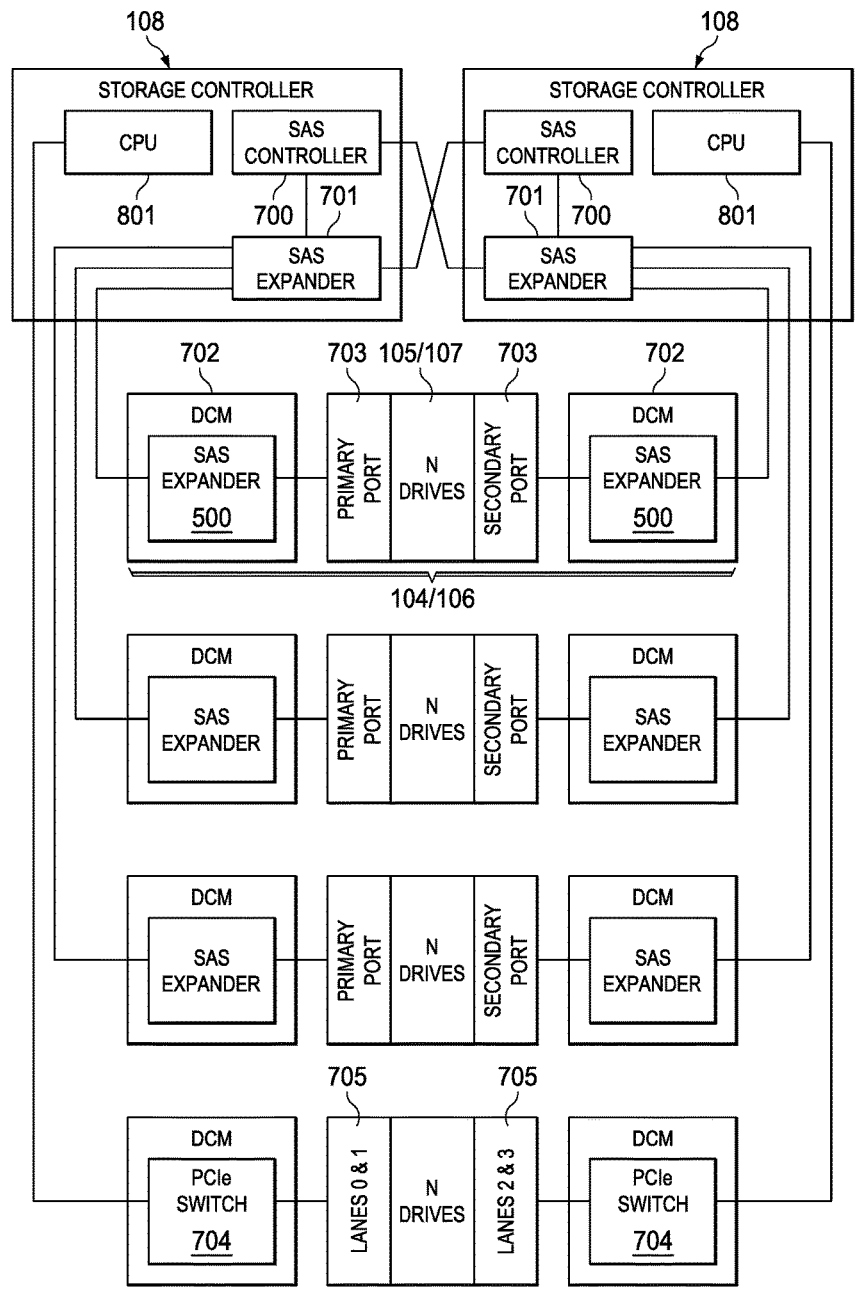
FIG. 7 is a block diagram of a modular dense storage array according to some embodiments.

FIG. 7 is a block diagram of a modular dense storage array according to some embodiments. Particularly, two storage controllers 108 (e.g., one may be a redundant controller for failsafe operation or the like) are coupled to a plurality of drive bay modules 104/106. Each storage controller 108 includes a Central Processing Unit (CPU) 801, SAS controller 700, and SAS expander 701. In some cases, each SAS expander 701 may be coupled, via connectors 603 of mid-plane 302, to a respective Drawer Control Module (DCM) 702 having a SAS expander 500 using wire(s) or cable(s). Each SAS expander 500 may in turn be coupled to a port (primary or secondary) of drive bay modules 104/106 via corresponding bottom-planes 300/301.

In some implementations, elements located on the left hand side of FIG. 7 may be sufficient to enable various storage operations using the storage array, and elements located on the right hand side of FIG. 7 may provide redundant access to drives 105/107. To that end, in some cases, each SAS controller 700 may be coupled to both of SAS expanders 701.

When different protocols are used, SAS controllers 700 and SAS expanders 500/701, may be replaced with controllers and expanders corresponding those protocols. Additionally or alternatively, other controllers and expanders may be added. Also, in some cases, communications between storage controllers 108 and drive bay modules 104/106 may be had over the PCIe protocol. In that case, CPUs 801 may communicate directly with PCIe switches 704, which in turn are coupled to lanes 705 of drive bay modules 104/106.

Figure 8:
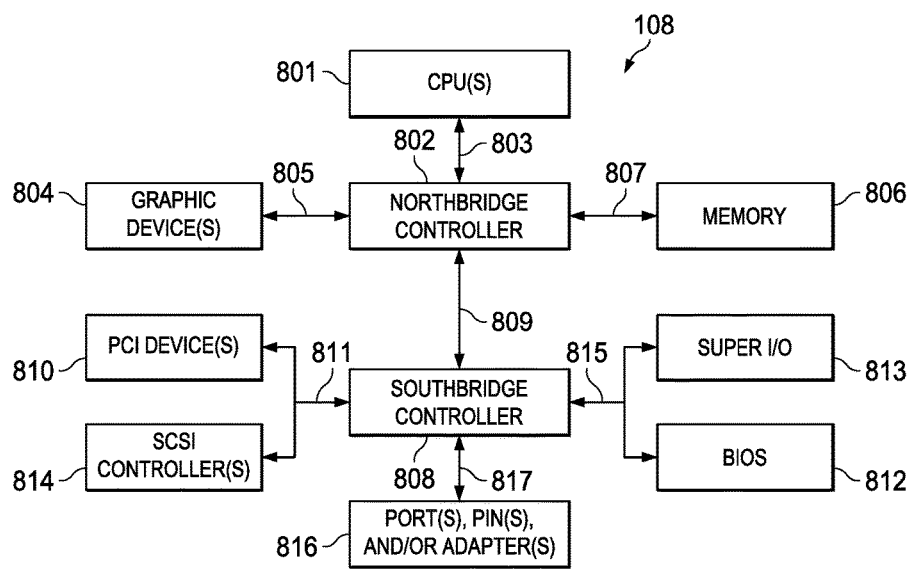
FIG. 8 is a block diagram of an Information Handling System (IHS) according to some embodiments.

FIG. 8 is a block diagram an example of an IHS used to implement each storage controller 108 according to some embodiments. As shown, storage controller 108 includes one or more CPUs 801. In various embodiments, storage controller 108 may be a single-processor system including one CPU 801, or a multi-processor system including two or more CPUs 801 (e.g., two, four, eight, or any other suitable number). CPU(s) 801 may include any processor capable of executing program instructions. For example, in various embodiments, CPU(s) 801 may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of CPU(s) 801 may commonly, but not necessarily, implement the same ISA.

CPU(s) 801 are coupled to northbridge controller or chipset 801 via front-side bus 803. Northbridge controller 802 may be configured to coordinate I/O traffic between CPU(s) 801 and other components. For example, in this particular implementation, northbridge controller 802 is coupled to graphics device(s) 804 (e.g., one or more video cards or adaptors, etc.) via graphics bus 805 (e.g., an Accelerated Graphics Port or AGP bus, a Peripheral Component Interconnect or PCI bus, etc.). Northbridge controller 802 is also coupled to system memory 806 via memory bus 807. Memory 806 may be configured to store program instructions and/or data accessible by CPU(s) 801. In various embodiments, memory 806 may be implemented using any suitable memory technology, such as static RAM (SRAM), synchronous dynamic RAM (SDRAM), nonvolatile/Flash-type memory, or any other type of memory.

Northbridge controller 802 is coupled to southbridge controller or chipset 808 via internal bus 809. Generally speaking, southbridge controller 808 may be configured to handle various of storage controller 108's I/O operations, and it may provide interfaces such as, for instance, Universal Serial Bus (USB), audio, serial, parallel, Ethernet, etc., via port(s), pin(s), and/or adapter(s) 816 over bus 817. For example, southbridge controller 808 may be configured to allow data to be exchanged between storage controller 108 and other devices, such as other IHSs attached to a network. In various embodiments, southbridge controller 808 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 808 may also enable connection to one or more keyboards, keypads, touch screens, scanning devices, voice or optical recognition devices, or any other devices suitable for entering or retrieving data. Multiple I/O devices may be present in storage controller 108. In some embodiments, I/O devices may be separate from storage controller 108 and may interact with IHS 100 through a wired or wireless connection. As shown, southbridge controller 808 is further coupled to one or more PCI devices 810 (e.g., modems, network cards, sound cards, video cards, etc.) and to one or more SCSI controllers 814 (e.g., SAS controllers 700) via parallel bus 811. Southbridge controller 808 is also coupled to Basic I/O System (BIOS) 812 and to Super I/O Controller 813 via Low Pin Count (LPC) bus 115.

BIOS 812 includes non-volatile memory having program instructions stored thereon. Those instructions may be usable CPU(s) 801 to initialize and test other hardware components and/or to load an Operating System (OS) onto storage controller 108. Super I/O Controller 813 combines interfaces for a variety of lower bandwidth or low data rate devices. Those devices may include, for example, floppy disks, parallel ports, keyboard and mouse, temperature sensor and fan speed monitoring/control, etc.

In some cases, storage controller 108 may be configured to provide access to different types of computer-accessible media separate from memory 806 (e.g., hard drives 105 and 107 shown in FIG. 1). Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to storage controller 108 via northbridge controller 802 and/or southbridge controller 808.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that storage controller 108 is merely illustrative and is not intended to limit the scope of the disclosure described herein. In particular, any computer system and/or device may include any combination of hardware or software capable of performing certain operations described herein.

In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 802 may be combined with southbridge controller 808, and/or be at least partially incorporated into CPU(s) 801. In other implementations, one or more of the devices or components shown in FIG. 8 may be absent, or one or more other components may be added. Accordingly, systems and methods described herein may be implemented or executed with other IHS configurations.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A storage system, comprising:
   a chassis having a plurality of slots configured to receive T-shaped rails, wherein the plurality of slots is disposed on a same wall of the chassis and configured to provide adjustable spacing between at least two neighboring T-shaped rails;
   a first drive bay module configured to receive a first drive having a first form factor, wherein the first drive bay module has a first set of L-shaped tabs, and wherein an L-shaped tab of the first set allows the first drive bay module to slide in and out of a first one of the two neighboring T-shaped rails within the chassis in a given direction; and a second drive bay module configured to receive a second drive having a second form factor, wherein the second drive bay module has a second set of L-shaped tabs, wherein an L-shaped tab of the second set allows the second drive bay module to slide in and out of a second one of the two neighboring T-shaped rails within the chassis in the given direction.

2. The storage system of claim 1, wherein the first drive has a 3.5-inch form factor, and wherein the second drive has a 2.5-inch form factor.

3. The storage system of claim 1, wherein each of the drive bay modules includes a first protocol expander device located at one end of the module and a second protocol expander device located at the other end of the module.

4. The storage system of claim 3, wherein the first and second protocol expander devices are Serial Attached Small Computer System Interface (SCSI) (SAS) devices or Peripheral Component Interconnect (PCI) Express (PCIe) devices.

5. The storage system of claim 3, wherein each of the drive bay modules includes a bottom-plane, wherein each bottom-plane includes a plurality of connectors, and wherein each of the plurality of connectors is configured to receive a corresponding drive.

6. The storage system of claim 5, wherein the first module includes a first bottom-plane configured to accommodate the first form factor, wherein the second module includes a second bottom-plane configured to accommodate the second form factor, and wherein the first bottom-plane is wider than the second bottom-plane.

7. The storage system of claim 5, wherein the chassis includes a mid-plane, and wherein the mid-plane includes: a first set of connectors configured to be coupled to a first set of protocol expander devices located at an end of the drive bay modules via corresponding bottom-plane connectors, and a second set of connectors configured to be coupled to a second set of protocol expander devices located at another end of the drive bay modules via corresponding bottom-plane connectors.

8. The storage system of claim 7, wherein the chassis is configured to receive a storage controller, and wherein the storage controller is configured to be coupled to the mid-plane.

9. The storage system of claim 8, wherein the storage controller includes a protocol expander device coupled to a protocol controller, and wherein the protocol expander device is configured to be coupled to the first set of protocol expander devices.

10. The storage system of claim 9, wherein the chassis is configured to receive another storage controller, and wherein the other storage controller is configured to be coupled to the mid-plane.

11. The storage system of claim 10, wherein the other storage controller includes another protocol expander device coupled to another protocol controller, and wherein the other protocol expander device is configured to be coupled to the second set of protocol expander devices.

12. The storage system of claim 11, wherein the protocol controller is configured to be coupled to the other protocol expander device and wherein the other protocol controller is configured to be coupled to the protocol expander device.

13. The storage system of claim 1, wherein each drive bay module has a set of four tabs.

14. The storage system of claim 1, wherein each of the drive bay modules includes a bottom-plane, wherein each bottom-plane includes a plurality of connectors, and wherein each of the connectors is configured to receive a corresponding drive.

15. The storage system of claim 1, wherein the chassis includes a mid-plane, and wherein the mid-plane includes: a first set of connectors configured to be coupled to a first set of protocol expander devices located at an end of the first drive bay module via corresponding bottom-plane connectors, and a second set of connectors configured to be coupled to a second set of protocol expander devices located at another end of the first drive bay module via corresponding bottom-plane connectors.

* * * * *